(12) United States Patent
Albright et al.

(10) Patent No.: US 9,748,894 B2
(45) Date of Patent: Aug. 29, 2017

(54) FLEXIBLE BUILDING-INTEGRATED PHOTOVOLTAIC STRUCTURE

(71) Applicant: Global Solar Energy, Inc., Tucson, AZ (US)

(72) Inventors: Scot Albright, Tucson, AZ (US); Jeffrey S. Britt, Tucson, AZ (US); Eric Kanto, Tucson, AZ (US); Urs Schoop, Tucson, AZ (US); Darren Verebelyi, Tucson, AZ (US)

(73) Assignee: Global Solar Energy, Inc., Tucson, AZ (US)

( * ) Notice: Subject to any disclaimer, the term of this patent is extended or adjusted under 35 U.S.C. 154(b) by 246 days.

(21) Appl. No.: 14/742,089

(22) Filed: Jun. 17, 2015

(65) Prior Publication Data

US 2015/0288323 A1      Oct. 8, 2015

Related U.S. Application Data

(63) Continuation of application No. 13/222,991, filed on Aug. 31, 2011, now abandoned.
(Continued)

(51) Int. Cl.
*H01L 21/00* (2006.01)
*H01L 27/146* (2006.01)
(Continued)

(52) U.S. Cl.
CPC .............. *H02S 20/26* (2014.12); *B32B 37/18* (2013.01); *B32B 37/187* (2013.01);
(Continued)

(58) Field of Classification Search
CPC ...... H02S 20/26; H02S 20/23; B32B 38/0012; B32B 37/187; H01L 31/048; H01L 51/5253
See application file for complete search history.

(56) References Cited

U.S. PATENT DOCUMENTS

| 4,705,911 A | 11/1987 | Nakano et al. |
| 7,760,992 B2 | 7/2010 | Wendt et al. |

(Continued)

FOREIGN PATENT DOCUMENTS

| JP | 2002-26344 A | 1/2002 |
| JP | 2002-83978 A | 3/2002 |
| WO | 2009126115 A1 | 10/2009 |

OTHER PUBLICATIONS

Dec. 23, 2011, International Search Report and Written Opinion of the International Searching Authority from The US Receiving Office in PCT Patent Application No. PCT/US2011/049983.
(Continued)

*Primary Examiner* — Alonzo Chambliss
(74) *Attorney, Agent, or Firm* — Kolisch Hartwell, P.C.

(57) ABSTRACT

Improved BIPV materials configured to meet various long-term requirements including, among others, a high degree of water resistance, physical durability, electrical durability, and an ability to withstand variations in temperature and other environmental conditions. In some embodiments, the disclosed BIPV materials include modules wherein two or more layers of the module are configured to be joined together during lamination to protect edge portions of the top sheet and/or back sheet of the module, such as in the vicinity of any multi-layer vapor barrier structure(s) of the module.

20 Claims, 3 Drawing Sheets

Related U.S. Application Data

(60) Provisional application No. 61/378,801, filed on Aug. 31, 2010.

(51) Int. Cl.

| | | |
|---|---|---|
| *H01L 31/00* | (2006.01) | |
| *H02S 20/26* | (2014.01) | |
| *B32B 37/00* | (2006.01) | |
| *H01L 31/048* | (2014.01) | |
| *H02S 20/23* | (2014.01) | |
| *B32B 37/18* | (2006.01) | |
| *B32B 38/00* | (2006.01) | |

(52) U.S. Cl.
CPC ........ *B32B 38/0012* (2013.01); *H01L 31/048* (2013.01); *H02S 20/23* (2014.12); *B32B 2307/7242* (2013.01); *B32B 2331/04* (2013.01); *B32B 2457/12* (2013.01); *Y02B 10/12* (2013.01); *Y02E 10/50* (2013.01); *Y10T 29/49117* (2015.01); *Y10T 156/1034* (2015.01)

(56) References Cited

U.S. PATENT DOCUMENTS

| | | | |
|---|---|---|---|
| 2001/0011552 A1* | 8/2001 | Morizane .......... | B32B 17/10018 136/251 |
| 2001/0054262 A1 | 12/2001 | Nath et al. | |
| 2007/0295385 A1* | 12/2007 | Sheats ................. | H01L 31/0392 136/251 |
| 2007/0295390 A1* | 12/2007 | Sheats ................. | B32B 17/1077 136/251 |
| 2008/0023064 A1 | 1/2008 | Hayes et al. | |
| 2008/0041442 A1 | 2/2008 | Hanoka | |
| 2008/0053519 A1 | 3/2008 | Pearce et al. | |
| 2008/0302409 A1 | 12/2008 | Bressler et al. | |
| 2009/0114262 A1* | 5/2009 | Adriani ................ | B23K 1/0008 136/244 |
| 2010/0071757 A1 | 3/2010 | Krajewski et al. | |
| 2010/0147364 A1 | 6/2010 | Gonzalez et al. | |
| 2010/0297798 A1* | 11/2010 | Adriani ............. | B32B 17/10678 438/64 |
| 2011/0009160 A1* | 1/2011 | Zhu ......................... | H04W 8/26 455/551 |
| 2012/0090661 A1* | 4/2012 | Capps .................. | H01L 31/048 136/246 |
| 2012/0118356 A1* | 5/2012 | Albright ................ | B32B 15/08 136/251 |

OTHER PUBLICATIONS

Mar. 5, 2013, International Preliminary Report on Patentability from The International Bureau of WIPO in PCT Patent Application No. PCT/US2011/049983.

Apr. 4, 2014, First Action Interview Pilot Program Pre-Interview Communication from the U.S. Patent and Trademark Office, in U.S. Appl. No. 13/222,991.

Jul. 10, 2014, Office Action from the U.S. Patent and Trademark Office, in U.S. Appl. No. 13/222,991.

Oct. 8, 2014, Office Action from the U.S. Patent and Trademark Office, in U.S. Appl. No. 13/222,991.

Jan. 6, 2015, Office Action from the People's Republic of China in Chinese Patent Application No. 201180041663.2.

Feb. 20, 2015, Office Action from the U.S. Patent and Trademark Office, in U.S. Appl. No. 13/222,991.

May 19, 2015, Office Action from the Japanese Patent Office in Japanese Patent Application No. 2013-527269.

* cited by examiner

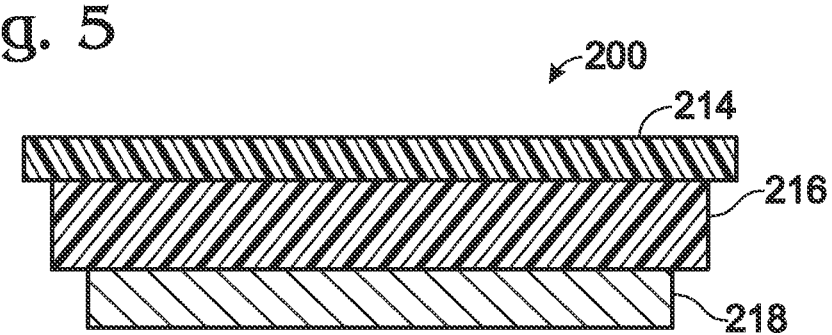

FLEXIBLE BUILDING-INTEGRATED PHOTOVOLTAIC STRUCTURE

CROSS-REFERENCE TO RELATED APPLICATION(S)

This application is a continuation of U.S. patent application Ser. No. 13/222,991, which claims priority under 35 U.S.C. §119 and applicable foreign and international law to U.S. Provisional Patent Application Ser. No. 61/378,801, filed Aug. 31, 2010, which is hereby incorporated by reference in its entirety.

BACKGROUND

Building-integrated photovoltaic (BIPV) materials generally include materials that generate electricity through the use of solar cells (PV cells), and that are configured to be installed onto the roof or side of a building. Once installed, BIPV materials serve as protective roofing or siding materials and also generate electricity. Accordingly, it is desirable that BIPV materials be flexible and be capable of maintaining both their protective and electricity-generating characteristics for a long period of time, such as 10 years, 20 years, or even longer.

BIPV modules generally include a multi-layer top sheet overlying the solar cells, and a multi-layer back sheet underlying the solar cells. The top sheet and the back sheet are each configured to protect the solar cells from exposure to the elements, and particularly from exposure to water and water vapor, and are typically joined together by a process such as lamination. To accomplish this protective function, one or both of the top sheet and the back sheet may include a vapor barrier, which may itself be part of a separate multi-layer structure.

Two areas in which BIPV modules may be particularly susceptible to water incursion are at the edge portions of the multi-layer top sheet and back sheet, particularly in the vicinity of the vapor barrier(s). If water enters at these edge portions, it can penetrate between layers of the top sheet and/or back sheet, and compromise the mechanical and electrical stability of those structures. Accordingly, a BIPV module offering improved protection for the edge portions of the top sheet and back sheet would provide desirable improvement to the mechanical stability and longevity of the module.

SUMMARY

The present teachings disclose improved BIPV materials configured to meet various long-term requirements including, among others, a high degree of water resistance, physical durability, electrical durability, and an ability to withstand variations in temperature and other environmental conditions. In some embodiments, the disclosed BIPV materials include modules wherein two or more layers of the module are configured to be joined together during lamination to protect edge portions of the top sheet and/or back sheet of the module, such as in the vicinity of any multi-layer vapor barrier structure(s) of the module.

BRIEF DESCRIPTION OF THE DRAWINGS

FIG. 5 is a sectional view of a separate top sheet portion of a photovoltaic module, according to aspects of the present teachings.

DESCRIPTION

The present teachings disclose methods and apparatus for manufacturing, assembling and installing BIPV materials that incorporate flexible, thin-film photovoltaic materials. The disclosed BIPV materials are configured to meet various long-term requirements including, among others, a high degree of water resistance, physical durability, electrical durability, and an ability to withstand variations in temperature and other environmental conditions. In some embodiments, the disclosed BIPV materials include modules wherein two or more layers of the module are configured to be joined together to protect edge portions of the top sheet and/or back sheet of the module, such as in the vicinity of any multi-layer vapor barrier structure(s) of the module.

Figure 1:
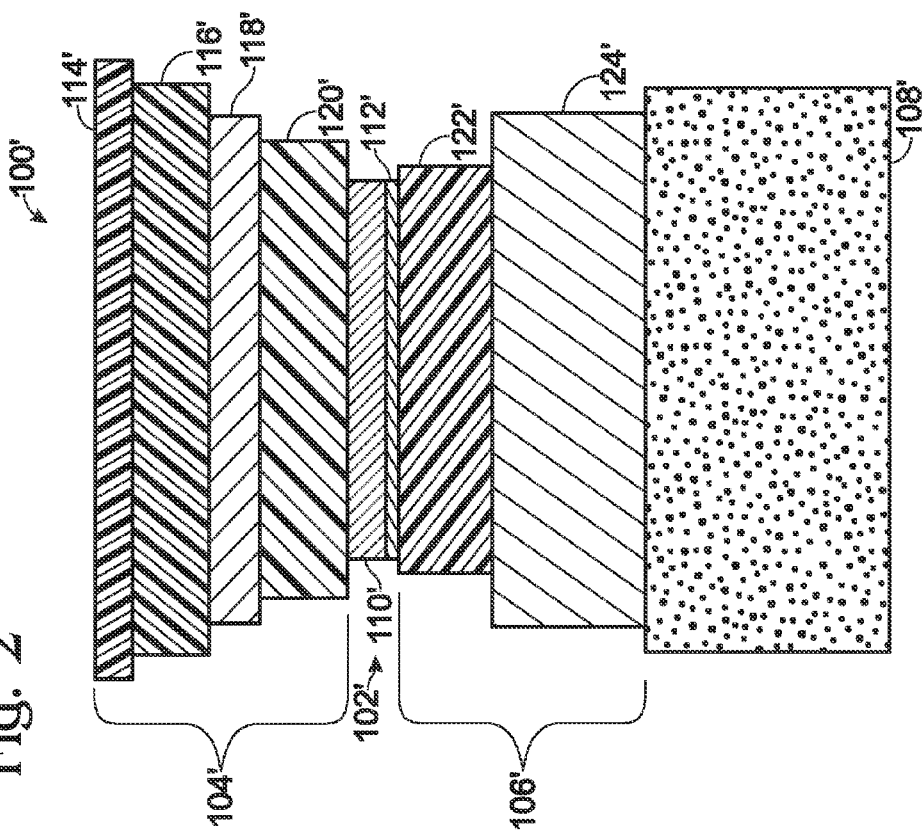
FIG. 1 is a sectional view of a photovoltaic module, according to aspects of the present teachings.

FIG. 1 is a sectional view of a photovoltaic module, generally indicated at 100, according to aspects of the present teachings. Module 100 includes a PV cell layer generally indicated at 102, a top sheet generally indicated at 104, and a bottom sheet generally indicated at 106. Module 100 also may include a roof mounting layer such as a butyl mastic adhesive layer 108. As described in more detail below, PV cell layer 102, top sheet 104, and bottom sheet 106 each may themselves include multiple layers of material serving various purposes.

More specifically, PV cell layer 102 may include a plurality of interconnected photovoltaic cells, each having a similar structure. For example, the cells of layer 102 may be thin film PV cells that include a semiconductor absorber layer 110 and a substrate 112 upon which the absorber layer is supported. Semiconductor absorber layer 110 may include a layer of copper indium gallium diselenide (CIGS) as the p-type semiconductor layer, and a layer of cadmium sulfide (CdS) as the n-type semiconductor layer, although many other photovoltaic absorber layers are known. A description of a CIGS/CdS type photovoltaic cell may be found in U.S. Pat. No. 7,760,992 to Wendt et al., which is hereby incorporated by reference in its entirety. A plurality of such cells, each having a typical cross sectional thickness of 20-40 microns ($\mu$m), may be joined together in electrical series, for example with conductive ribbons or tabs (not shown).

Top sheet 104 may include various layers, such as an upper protective layer 114, an upper encapsulant layer 116, a vapor barrier structure 118, and a lower encapsulant layer 120.

Upper protective layer 114 of top sheet 104 is configured to protect the underlying layers from abrasion, puncture, and shock damage (e.g. from hail stones), among others. The upper protective layer may be constructed, for example, of a substantially transparent, flexible, weatherable fluoropolymer material, such as an ethylene tetrafluoroethylene (ETFE) fluoropolymer, with a cross sectional thickness of approximately 30-150 $\mu$m.

Upper encapsulant layer 116 and lower encapsulant layer 120 each may be substantially transparent flexible layers constructed from a material such as ethylene vinyl acetate (EVA), each with a cross sectional thickness of 200-500 $\mu$m.

More generally, upper encapsulant layer 116 and lower encapsulant layer 120 each may be thermoplastic layers, or alternatively, one or both of layers 116 and 120 may be thermoset layers. The use of a non-peroxide cross-linking agent in a thermoset EVA material may be particularly suitable for lower encapsulant layer 120, because layer 120 is in close proximity to PV cell layer 102, and peroxide-free materials may reduce degradation of the PV material of the PV cell layer. In some cases, an encapsulant may be a multi-layer structure, including layers such as a layer of EVA and a separate UV absorber layer, among others.

Vapor barrier structure 118 may itself be a multi-layer structure having a total cross sectional thickness in the range of approximately 50-150 µm. Providing a relatively thick and/or relatively thick vapor barrier structure may help to avoid wrinkling of the module, particularly near its perimeter. Vapor barrier structure 118 will generally include several layers (not shown) such as a vapor barrier layer constructed from, for example, a thin layer of metal-oxide material, and one or more underlying and/or overlying layers of insulating material such as polyethylene terephthalate (PET) and/or polyethylene naphthalate (PEN). Because PET and PEN may be susceptible to damage by ultraviolet (UV) radiation, an intervening layer of EVA or some other material containing a UV blocker may be disposed between the vapor barrier layer and the PET and/or PEN layers. For the same reason, upper encapsulant layer 116 may contain a UV blocking agent.

Like top sheet 104, bottom sheet 106 also may include several layers, such as a bottom encapsulant layer 122 and a multi-layer back sheet structure 124. Unlike the layers disposed above PV cell layer 102, however, the layers of bottom sheet 106 need not be transparent.

In any case, bottom encapsulant layer 122, which is depicted in FIGS. 1-4 to be in direct contact with the underside of PV cell layer 102, may be constructed from a thermoplastic material such as material reference number Z68 manufactured by the dnpSolar section of the DNP Corporation of Karlslunde, Denmark. The use of a thermoplastic material for bottom encapsulant layer 122 may improve adhesion to the back side of the PV cells of layer 102 (which may, for example, be coated with molybdenum), helping to reduce delamination of the bottom encapsulant from the PV layer. In addition, a thermoplastic bottom encapsulant layer may be sufficiently flexible to reduce forces on the PV layer that can lead to buckling of the ribbons connecting the PV cells, and may allow effective non-vacuum lamination, such as rapid pressure lamination performed in the presence of air, while still covering high-relief structures or components such as bypass diodes (not shown) disposed below the PV layer. Providing bypass diodes in electrical parallel with the PV cells may help to avoid power loss, hysteresis and damage to the module when a particular cell is damaged, weak or shaded. By disposing the bypass diodes under the module, this can be accomplished while shielding the diodes from UV radiation and without decreasing the solar exposure area of the module.

Back sheet structure 124 may include a plurality of layers, such as a thin film metal vapor barrier layer applied to a polymer. Back sheet 124 is generally configured to protect the underside of PV cell layer 102 from the ingress of water and other contaminants, while providing a mechanically stable module with minimal thermo-mechanical stresses. Examples of back sheet structures suitable for use in conjunction with the present teachings are described, for instance, in U.S. patent application Ser. No. 13/104,568, which is hereby incorporated by reference in its entirety.

As depicted in FIG. 1, various module layers such as upper protective layer 114, upper encapsulant layer 116, lower encapsulant layer 120, bottom encapsulant layer 122, multi-layer back sheet structure 124, and/or adhesive layer 108, each may extend beyond the edge portions of vapor barrier structure 118. Accordingly, some or all of these layers may be configured to join with at least one of the other layers, for example, during a module lamination process, to cover and protect the edge portions of the vapor barrier.

More specifically, upper protective layer 114 and/or upper encapsulant layer 116 may be configured to join with lower encapsulant layer 120, bottom encapsulant layer 122, back sheet 124, and/or any additional encapsulant layer (not shown) disposed below the vapor barrier structure, to cover and protect the edge portions of vapor barrier structure 118. This may inhibit or even prevent the ingress of water and water vapor between the layers of the vapor barrier structure, resulting in increased stability and longevity of the vapor barrier structure and the overall module.

While the previous description has focused on protection of edge portions of a vapor barrier structure disposed above a PV cell layer, similar methods and apparatus may be used to protect other edge portions of a PV module, such as edge portions of a multi-layer back sheet. For example, various of the module layers such as upper protective layer 114, upper encapsulant layer 116, lower encapsulant layer 120, and/or bottom encapsulant layer 122 may be configured to join with adhesive layer 108 (for example, in a lamination process) to cover and protect the edge portions of multi-layer back sheet 124. This may inhibit contaminants such as moisture from penetrating between the layers of the back sheet, resulting in increased stability and longevity of the back sheet and the overall module.

FIG. 1 depicts upper protective layer 114, upper encapsulant layer 116, lower encapsulant layer 120, bottom encapsulant layer 122, back sheet 124, and adhesive layer 108 all extending further laterally than the lateral edge portions of vapor barrier structure 118. Similarly, the aforementioned layers all may extend further longitudinally than the longitudinal edge portions (not shown) of vapor barrier structure 118. For example, if module 100 is manufactured in a roll-to-roll process, the vapor barrier structure may be applied discontinuously, to leave gaps in which the various protective and encapsulant layers overlap the vapor barrier structure longitudinally. The continuous material then may be cut across these gaps, leaving discrete modules in which one or more protective layers overlaps the vapor barrier structure.

Figure 2:
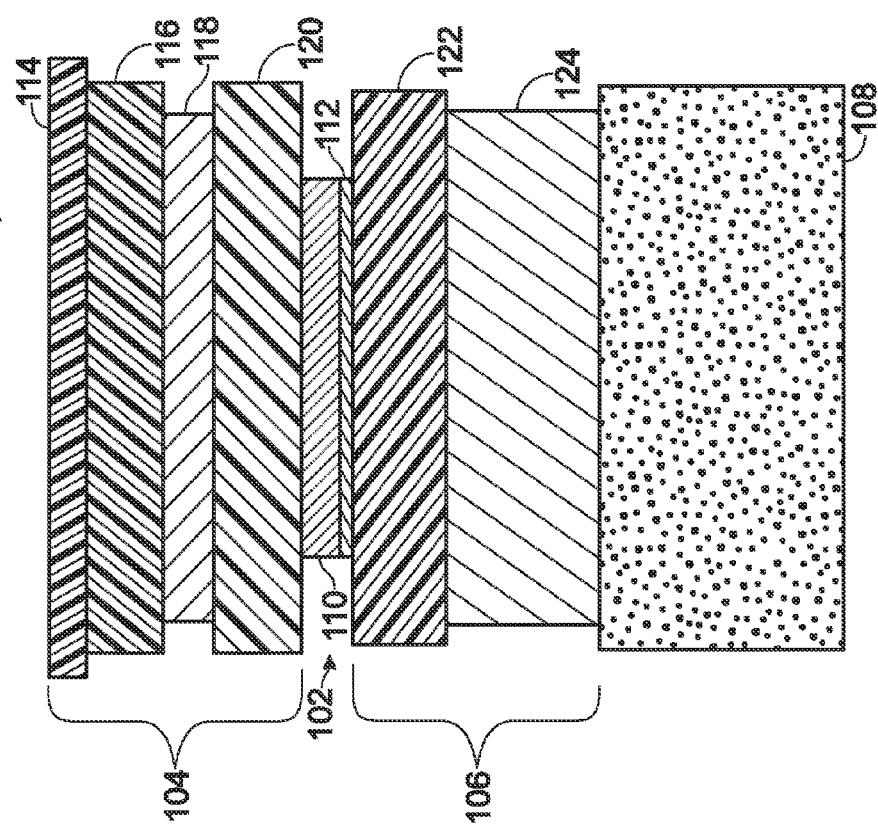
FIG. 2 is a sectional view of another photovoltaic module, according to aspects of the present teachings.

It need not be the case that all (or any) of the protective layers of a module extend beyond edge portions of the vapor barrier structure. For example, FIG. 2 is a sectional view of another photovoltaic module, generally indicated at 100', according to aspects of the present teachings. The components of module 100' are substantially similar to the components of module 100, and primed reference numbers are used in FIG. 2 to refer to components similar to their unprimed counterparts in FIG. 1. In module 100', however, which is depicted prior to a lamination process, lower encapsulant layer 120' and bottom encapsulant layer 122' each have lateral linear dimensions smaller than corresponding linear dimensions of vapor barrier structure 118'.

In the example of FIG. 2, heat and/or pressure applied during the lamination process causes lower encapsulant layer 120' and bottom encapsulant layer 122' to be squeezed laterally outward, beyond the lateral edge portions of vapor barrier structure 118'. The same statements may apply to the longitudinal direction, if lower encapsulant layer 120' and bottom encapsulant layer 122' initially have longitudinal linear dimensions smaller than the corresponding linear dimensions of the vapor barrier structure. Thus, lower encapsulant layer 120' and bottom encapsulant layer 122' will have linear dimensions greater than corresponding linear dimensions of vapor barrier structure 118' subsequent to the lamination process, and these layers still may be configured to cover and protect the edge portions of the vapor barrier structure. Generally, any protective layer may be configured to have linear dimensions smaller than corresponding linear dimensions of the vapor barrier structure prior to a lamination process, and to have linear dimensions greater than corresponding linear dimensions of the vapor barrier structure subsequent to a lamination process.

Figure 3:
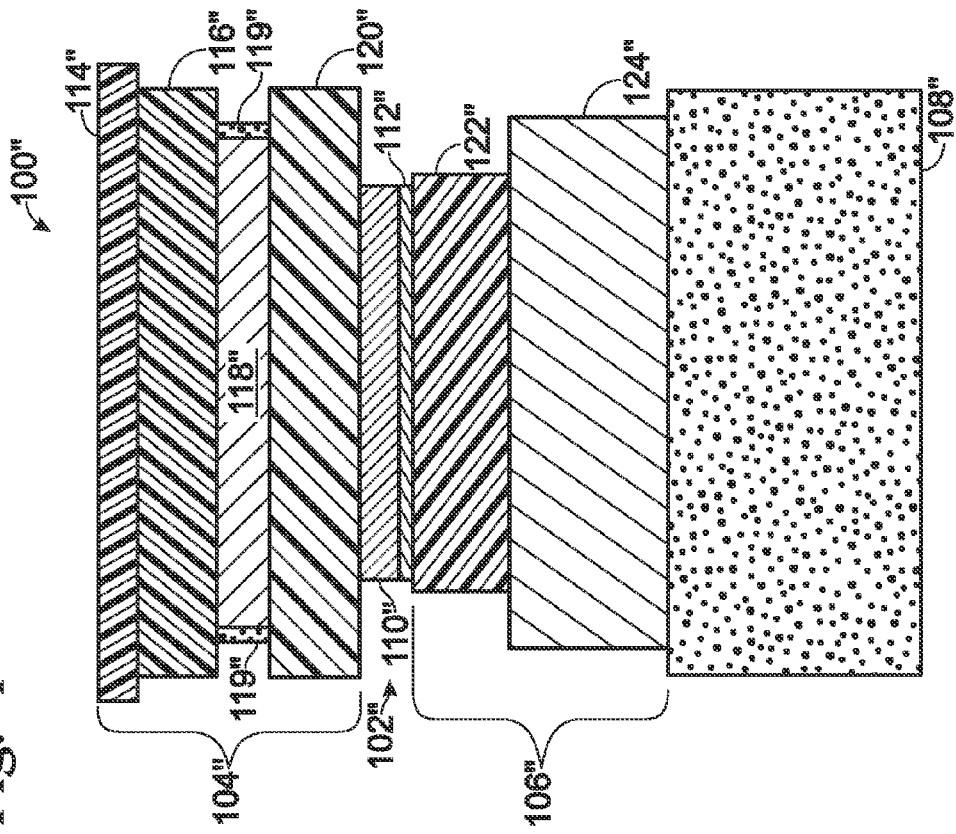
FIG. 3 is a sectional view of yet another photovoltaic module, according to aspects of the present teachings.

FIG. 3 is a sectional view of yet another photovoltaic module, generally indicated at 100", according to aspects of the present teachings. Module 100" is substantially similar to modules 100 and 100', and double primed numbers are used to refer to corresponding components having the same unprimed and primed reference numbers in FIGS. 1 and 2, respectively. In FIG. 3, however, only bottom encapsulant layer 122" is configured to have linear dimensions smaller than corresponding linear dimensions of the vapor barrier structure prior to a lamination process, and to have linear dimensions greater than corresponding linear dimensions of the vapor barrier structure subsequent to a lamination process.

Regardless of the linear dimensions of any particular protective layer, laminating the module may result in a change in the cross sectional area of one or more of the protective layers. For example, application of heat and/or pressure during lamination may cause the cross sectional area of lower encapsulant layer 120 (and 120', 120") and/or bottom encapsulant layer 122 (and 122', 122") to become non-uniform. More specifically, subsequent to lamination of the module, the cross sectional area of these encapsulant layers near the edge portions of the module may be substantially reduced compared to the cross sectional areas of the encapsulant layers in an interior portion of the module. In other words, the encapsulant layers may become tapered near the edges of the module during lamination. This results in a smaller thickness of encapsulant near the edges of the vapor barrier structure, which provides a correspondingly reduced opportunity for water to penetrate through the encapsulant and between layers of the vapor barrier structure.

Reducing the cross sectional area of various protective layers near edge portions of the module may be facilitated by providing protective layers (such as encapsulant layers) with reduced linear dimensions, as depicted in FIGS. 2-3. For instance when one or both of lower encapsulant layer 120' and bottom encapsulant layer 122' have linear dimensions smaller than corresponding linear dimensions of the vapor barrier structure and the back sheet prior to lamination of the module, this can minimize the cross sectional area between the vapor barrier structure and the back sheet near the edge portions of the module subsequent to lamination of the module.

Figure 4:
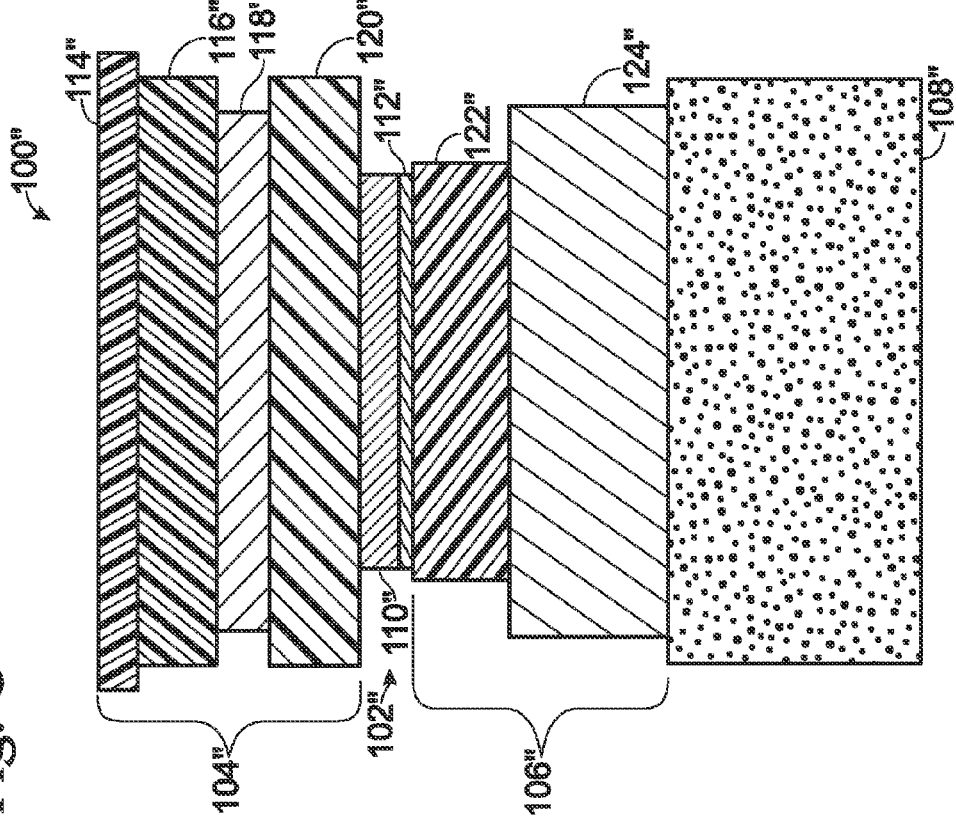
FIG. 4 is another sectional view of the photovoltaic module of FIG. 3, including the addition of an adhesive layer disposed near the perimeter of the module, according to aspects of the present teachings.

FIG. 4 is another sectional view of module 100" of FIG. 3, except that the module has been modified slightly according to aspects of the present teachings. Specifically, module 100" now includes a layer of adhesive 119" disposed at a perimeter portion of the module. More specifically, FIG. 4 depicts adhesive layer 119" disposed along the edge portions of vapor barrier structure 118". This may facilitate adhesion of other protective layers to the edge portions of the vapor barrier structure during lamination.

More generally, an adhesive layer such as layer 119" may be disposed at or near any perimeter portion of the module, to facilitate protection of edge portions of the module subsequent to lamination. The adhesive layer may be constructed from an adhesive encapsulant similar to the other encapsulant materials of the module, or it may be constructed from any other suitable material that is configured to bond securely with edge portions of the vapor barrier structure and/or with other layers of the module that are configured to protect the edge portions of the vapor barrier structure.

In some cases, a top sheet structure including a vapor barrier may be manufactured separately from the remainder of a BIPV module, as a standalone component. FIG. 5 is a sectional view of such a top sheet structure, generally indicated at 200, which may be suitable for use with the present teachings. Top sheet structure 200 includes an upper protective layer 214, an upper encapsulant layer 216, and a vapor barrier structure 218. These components are substantially similar to the corresponding components of module 100, as indicated by similar numbering. Accordingly, a separately produced top sheet structure may have a cross sectional thickness in the range of approximately 280-800 µm. Providing a top sheet with a relatively large thickness, or which is otherwise desirably stiff, may help to reduce possible wrinkling of a module to which the top sheet is laminated, particularly near the edges of the module.

When a top sheet such as top sheet structure 200 is manufactured separately, it also may be separately laminated, in which case portions of upper protective layer 214 and/or upper encapsulant layer 216 may wrap around the edge portions of the vapor barrier structure during this initial lamination process. Furthermore, the vapor barrier structure itself may include a protective layer overlying the vapor barrier and/or a protective layer underlying the vapor barrier, in which case one or more of these protective layers may be configured to cover and protect edge portions of the vapor barrier structure after a lamination process. Thus, the edge portions of the vapor barrier structure may be covered and protected even before the top sheet structure is integrated with PV cells into a module. Alternatively or in addition, the top sheet may be provided to a module and then laminated, which may result in even better protection for the edge portions of the vapor barrier.

Generally, any protective layer overlying a vapor barrier structure (such as 118, 118', 118", or 218) and/or any protective layer underlying such a vapor barrier structure may be configured to cover and protect edge portions of the vapor barrier structure after a lamination process, either by being joined together as described above with respect to FIGS. 1-4, or because a single protective layer becomes disposed around the edge portions of the vapor barrier structure as described above with respect to FIG. 5. Typically, a separate top sheet structure will be laminated twice—once during its initial manufacture, and a second time during its integration into a PV module—in which case protection of the vapor barrier edge portions may occur through a combination of a single material wrapping around the edge portions and two or materials joining together around the edge portions. In an analogous manner, a separate multi-layer back sheet may be provided in some cases, with its edge portions protected at least partially through an initial lamination process, prior to integration of the back sheet into a PV module.

What is claimed is:
1. A method of manufacturing a photovoltaic module, comprising:

providing a bottom sheet including a back sheet and a bottom encapsulant layer overlying a radiation incident side of the back sheet;

disposing a plurality of electrically interconnected photovoltaic cells overlying a radiation incident side of the bottom encapsulant layer, each cell including a semiconductor absorber layer and a substrate upon which the absorber layer is supported;

preparing a standalone top sheet structure by performing the following steps:
constructing a vapor barrier structure by disposing a vapor barrier between first and second layers of insulating material;
placing an upper encapsulant layer overlying a radiation incident side of the vapor barrier structure;
placing an upper protective layer overlying a radiation incident side of the upper encapsulant layer; and
performing a first lamination process to laminate together the upper protective layer, the upper encapsulant layer and the vapor barrier structure;
placing the top sheet structure overlying a radiation incident side of the cells; and laminating the top sheet structure to the bottom sheet in a second lamination process so that at least one of the upper protective layer and the upper encapsulant layer joins with at least one of the bottom encapsulant layer and the back sheet to cover and protect the edge portions of the vapor barrier structure.

2. The method of claim 1, wherein the bottom sheet further includes an adhesive layer configured to join the module to a building surface.

3. The method of claim 1, wherein subsequent to the second lamination process, a cross sectional area of the bottom encapsulant layer near edge portions of the module is substantially reduced compared to a corresponding cross sectional area of the bottom encapsulant layer in an interior portion of the module.

4. The method of claim 1, wherein the upper encapsulant layer extends beyond the edge portions of the vapor barrier structure prior to the second lamination process, and is joined with at least one of the bottom encapsulant layer and the back sheet during the second lamination process.

5. The method of claim 1, wherein preparing the top sheet structure includes placing a lower encapsulant layer on a side of the vapor barrier structure opposite the radiation incident side.

6. The method of claim 5, wherein the first lamination process causes the lower encapsulant layer to be joined with at least one of the upper protective layer and the upper encapsulant layer.

7. A method of manufacturing a standalone top sheet structure for a photovoltaic cell, comprising:
constructing a vapor barrier structure by positioning a vapor barrier layer between underlying and overlying layers of insulating material;
positioning an upper encapsulant layer overlying a radiation incident side of the vapor barrier structure;
positioning an upper protective layer overlying a radiation incident side of the upper encapsulant layer; and
laminating the vapor barrier structure, the upper encapsulant layer and the upper protective layer together.

8. The method of claim 7, wherein the vapor barrier layer is constructed from a metal-oxide material.

9. The method of claim 7, further comprising positioning a first ultraviolet blocking layer between the vapor barrier layer and the overlying layer of insulating material.

10. The method of claim 9, further comprising positioning a second ultraviolet blocking layer between the vapor barrier layer and the underlying layer of insulating material.

11. The method of claim 7, further comprising positioning a lower encapsulant layer on a side opposite the radiation incident side of the vapor barrier structure, and wherein the lamination step includes laminating the lower encapsulant layer together with the vapor barrier structure, the upper encapsulant layer and the upper protective layer.

12. The method of claim 11, wherein prior to laminating, the lower encapsulant layer has a width less than a corresponding width of the vapor barrier structure, and wherein laminating causes the lower encapsulant layer to be squeezed laterally outward beyond the edge portions of the vapor barrier structure.

13. The method of claim 7, wherein after its manufacture, the standalone top sheet structure has a cross sectional thickness in the range of 280-800 micrometers.

14. A method of manufacturing a top sheet structure for a photovoltaic cell, comprising:
positioning a vapor barrier layer between lower and upper layers of insulating material;
positioning an upper encapsulant layer overlying the upper layer of insulating material;
positioning an upper protective layer overlying the upper encapsulant layer; and
laminating all of the layers together;
wherein the resulting laminated top sheet structure is configured as a standalone structure that may be laminated to a photovoltaic module in a further lamination step.

15. The method of claim 14, wherein the vapor barrier layer is constructed from a metal-oxide material.

16. The method of claim 14, further comprising positioning a first ultraviolet blocking layer between the vapor barrier layer and the upper layer of insulating material.

17. The method of claim 16, further comprising positioning a second ultraviolet blocking layer between the vapor barrier layer and the lower layer of insulating material.

18. The method of claim 14, further comprising positioning a lower encapsulant layer adjacent the lower layer of insulating material on a side opposed the vapor barrier layer, and wherein laminating all of the layers together includes laminating the lower encapsulant layer together with the remaining layers.

19. The method of claim 18, wherein prior to laminating, the lower encapsulant layer has a width less than a corresponding width of the vapor barrier layer, and wherein laminating causes the lower encapsulant layer to be squeezed laterally outward beyond the edge portions of the vapor barrier layer.

20. The method of claim 14, wherein the laminated top sheet structure has a cross sectional thickness in the range of 280-800 micrometers.

* * * * *